United States Patent [19]

St. John et al.

[11] Patent Number: 4,548,879
[45] Date of Patent: Oct. 22, 1985

[54] SOLDERABLE POLYMER THICK FILMS

[75] Inventors: Frank St. John, Patterson; Wayne Martin, Baldwin Place, both of N.Y.

[73] Assignee: Rohm and Haas Company, Philadelphia, Pa.

[21] Appl. No.: 612,184

[22] Filed: May 21, 1984

[51] Int. Cl.$^4$ ............................................. H01B 1/00
[52] U.S. Cl. .................................... 427/96; 252/512; 252/513; 427/216
[58] Field of Search ............... 252/512, 513; 427/216, 427/96; 106/290

[56] References Cited

U.S. PATENT DOCUMENTS

| | | | |
|---|---|---|---|
| 2,683,676 | 7/1954 | Perlman | 106/290 |
| 4,152,386 | 5/1979 | Winter | 252/512 |
| 4,331,714 | 5/1982 | Tyran | 252/512 |
| 4,333,966 | 6/1982 | Deffeyes | 427/96 |

FOREIGN PATENT DOCUMENTS

| | | | |
|---|---|---|---|
| 7519351 | 7/1975 | Japan | 252/512 |
| 0125273 | 8/1982 | Japan | 252/512 |
| 0074759 | 5/1983 | Japan | 252/512 |

*Primary Examiner*—Sam Silverberg
*Attorney, Agent, or Firm*—Michael B. Fein

[57] ABSTRACT

This invention discloses conductive compositions having improved solderability. These compositions contain metal and/or alloys thereof coated with saturated monocarboxylic acid which is dispersed in an organic polymeric matrix. Also disclosed is a method for preparing these conductive compositions. Another embodiment of the invention is a method of coating metal and/or alloys thereof with carboxylic acid.

27 Claims, No Drawings

SOLDERABLE POLYMER THICK FILMS

BACKGROUND OF THE INVENTION

1. Field of the Invention

This invention relates to conductive compositions which are generally referred to as polymer thick films. More particularly, the invention relates to conductive compositions which demonstrate improved solderability and methods for their production.

2. Description of the Prior Art

The prior art discloses electrically conductive resinous compositions containing metal powders or flakes or combinations thereof with various resins, such as, for example, epoxy resins, phenolic resins and polyester resins.

U.S. Pat. No. 3,412,043 discloses an electrically conductive resinous composition consisting essentially of silver flake, resinous binder, and finely divided inert filler. The invention lies in the discovery that conductive cements and coatings can be prepared which have excellent electrical and physical properties by incorporating a substantial amount of inert filler.

U.S. Pat. No. 3,030,237 discloses an improved coating composition essentially comprised of an organic resin carrier and a suitable metallic pigment. The coating and the electrical equipment to which it is applied have improved adhesion and electrical operating characteristics in comparison with conventional conducting coating materials. In connection with printed circuit boards, conventional wire leads may be silver-soldered to the cured coating using a common silver-soldering technique.

U.S. Pat. No. 2,280,135 discloses a conductive coating composition comprising metal of the group consisting of nickel, tin, bismuth, cadmium, chromium and silver, in the form of finely divided flakes, dispersed in a liquid medium comprising a film-forming organic substance and a volatile solvent therefor. These coatings are opaque and are of low light reflectivity on glass and the like.

U.S. Pat. No. 4,353,816 discloses a power conductive coating consisting of a mixture in a liquid condition of 70-85 wt. % of copper powder, 15-30 wt. % of at least one selected from the group consisting of phenol resin, epoxy resin, polyester resin and xylene resin, and 0.2-5 wt. % of at least one annex agent selected from the group of anthracene, anthracene carbonylic acid, anthranylic acid and anthrazine.

The prior art compositions are deficient in that they are not readily solderable.

It has been a long sought goal to provide electrically conductive resinous compositions which are readily solderable and which would utilize available materials to achieve the desired purpose at minimal cost.

In order for a polymer matrix to be highly electrically conductive it must contain metal. However, a polymer matrix containing ordinary metal is not readily solderable. Those materials that claim solderability can only do so under closely controlled processing conditions; the temperature and time must be too closely controlled to be useful in a typical manufacturing environment. The use of precious metals such as gold and silver is an alternative; however, it can be well appreciated that because of the high cost of these materials this method is expensive. Present day polymer conductors typically do contain silver or gold but they are also not directly solderable using ordinary techniques.

SUMMARY OF THE INVENTION

It is therefore an object of the present invention to provide novel compositions that are readily solderable.

It is another object of the invention to provide novel compositions that are readily solderable in which are contained non-precious metals.

It is a further object of the invention to provide compositions which were heretofore unsolderable, solderable.

It is still a further object to provide compositions which can be solderd under a wide range of processing conditions.

It is yet another object to provide a method for preparing readily solderable compositions. Another object of the invention is to provide a method for coating metal and/or alloys thereof with carboxylic acid.

Another object of the invention is to provide for articles of manufacture produced utilizing the composition of the instant invention.

These objects and other objects will become apparent, are achived by the present invention which comprises, in one aspect, a conductive composition having improved solderability comprising metal and/or alloys thereof coated with saturated monocarboxylic acid or mixtures thereof dispersed in an organic polymeric matrix. Another aspect of the invention comprises a process for preparing readily solderable conductive compositions comprising coating metal and/or alloys thereof with saturated monocarboxylic acid or mixtures thereof prior to dispersing the metal and/or alloys thereof in an organic polymeric matrix. Yet another aspect of the invention lies in a method of coating metal and/or alloys thereof with carboxylic acid or mixtures thereof.

DETAILED DESCRIPTION OF THE INVENTION

The composition of the instant invention comprises metal and/or alloys thereof coated with saturated monocarboxylic acid or mixtures thereof dispersed in an organic polymeric matrix.

Any metal and/or alloy thereof (hereinafter the term metal will be used to include metals and/or alloys thereof) may be used in the composition of the instant invention. This includes transition and non-transition metals; however, transition metals are preferred. The most preferred metal is nickel.

In the broadest sense of the invention there is no limitation related to the size, shape or form of the metal employed in the composition. The metal is, however, preferably in the form of powder, flake or sponge as those terms are known and understood by those skilled in the art to which this invention pertains.

In a narrower sense of the instant invention, a specific limitation should be mentioned with respect to the size of the metal employed. When the composition is applied to a substrate by a silk screening procedure, the upper limit of the particle size of the metal is 125 microns with the preferred range being 1-10 microns.

In the composition of the instant invention the metal is coated with saturated monocarboxylic acid or mixtures thereof. Unsaturated carboxylic acids are not effective. The saturated monocarboxylic acid that may be employed is defined by the formula

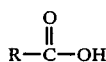

wherein R is a hydrocarbon group of the general formula $C_nH_{2n+1}$ wherein n is an integer from about 10 to about 18.

Any saturated monocarboxylic acid fitting the above description may be employed, including fatty acids. These acids represent commercial grade material and also synthetic grade material.

Saturated monocarboxylic acids that may be employed are decanoic, undecanoic, n-tridecanoic, tetradecanoic, n-pentadecanoic, hexadecanoic, nonadecanoic and dodeconic acids. Preferably octadecanoic acid is used. Most preferably, n-heptadecanoic acid is used.

The composition of the instant invention also contains an organic polymeric matrix. This organic polymeric matrix can be selected from thermoset resins such as, for example, epoxy resins and phenolic resins. Theoretically, any resin can be used so long as it maintains its integrity in the solder bath under processing conditions; that is, it substantially holds together and does not disintegrate.

The resin employed in the examples of the instant invention was made by mixing an o-creosol novolac resin (hydroxyl type) with an epoxy creosol novolac resin. The o-creosol novolac resin (hydroxyl type) is a multifunctional epoxy resin supplied by Ciba Geigy (HT/9490). The epoxy creosol novolac resin is a polyepoxide resin made by reacting orthocreosol novolac with epichlorohydrin. The polyepoxide resin so produced contains no more than two epoxy groups per molecule. This resin is also supplied by Ciba Geigy (ECN 1273).

The final composition of the instant invention should have a ratio of metal to organic polymeric matrix of from about 5:3 to about 20:1, by weight. Preferably the ratio of metal to organic polymeric matrix is about 10:1, by weight. Additionally, the final composition should have a ratio of saturated monocarboxylic acid to metal of from about 1:1000 to about 1:30, by weight. The preferred ratio of saturated monocarboxylic acid to metal is about 1:100, by weight.

The composition of the invention can be applied to a substrate by any conventional means such as, for example, by silk screening, dipping, brushing or spraying. The article so produced may be a laminate; specifically it may be a laminate of a printed circuit board and the composition applied thereto. It is preferable to use the silk screening procedure when the composition is applied to printed circuit boards. In this embodiment of the invention it should be remembered that the upper limit of the particle size of the metal is 125 microns with the preferred range being 1–10 microns. There are no other limitations pertaining to any other method of application of the composition to a substrate. Additionally, this composition may be applied to any type of substrate without having any undue limitations on its performance. The best use of the composition, however, is when it is applied to printed circuit boards. The film is usually applied at a thickness of from about 15 to about 50 microns.

Another embodiment of the invention is a process of coating metal with carboxylic acid or mixture thereof. This process comprises dissolving carboxylic acid or mixtures thereof in solvent, adding metal to the resultant solution of carboxylic acid and solvent and then evaporating the solvent to leave a dry powder or flake which is coated with carboxylic acid.

This pre-coating of the metal is done in a separate step with a desired percent addition of saturated carboxylic acid to metal being in the range of about 0.1 to about 3%, preferably 1%, by weight. Although this coating procedure has been only done with saturated monocarboxylic acids it is considered tenable that this method would apply to coating any carboxylic acid onto metal. The metal may take any form, preferably powder or flake.

The carboxylic acid employed must be soluble in the solvent. Alcohol is the preferred solvent although esters may be employed. Any solvent may be employed as long as the carboxylic acid is soluble therein. A preferred solvent is butyl carbitol acetate while a preferred alcohol is isopropyl alcohol. Water does not work as a solvent.

After the acid has been added to the solvent the solution is allowed to sit to allow for dissolution of the carboxylic acid in the solvent. The metal is then added thereto by any conventional means. Again the solution is allowed to sit until the metal is coated with carboxylic acid.

The solution is then allowed to sit at room temperature to allow the solvent to evaporate. Heat may be applied but care needs to be taken to avoid fire or explosion. What remains is metal coated with carboxylic acid. The metal in this state is visually virtually indistinguishable from when it is in its uncoated state.

Another aspect of the invention comprises a process for preparing readily solderable conductive compositions comprising coating metal with saturated monocarboxylic acid or mixtures thereof prior to dispersing the metal in an organic polymeric matrix.

The organic polymer matrix, metal, and saturated monocarboxylic acid are as described previously in this specification. The acid is coated also as hereinbefore described.

In one application of this embodiment the organic polymeric matrix can be dissolved in a solvent with metal coated with saturated monocarboxylic acid, as hereinbefore described, then dispersed in the resultant solution. The mixture formed thereby may be applied to a substrate which is subsequently cured. Examples of solvent that may be used to dissolve the organic polymeric matrix are esters such as butyl carbitol acetate. The mixture which is applied to the substrate may be cured by heating at temperatures from about 125° C. to about 200° C. for 30 seconds to two hours.

Solderability of a metallic surface refers to the ability of the metallic surface to be wetted with solder. The more easily the metallic surface is wetted with solder, the more readily solderable the surface is said to be. Any known method of soldering may be used for the purpose of the instant invention.

EXAMPLES

Example I

Process for Coating Metal

One tenth of a gram of octadecanoic acid was dissolved in five grams of isopropyl alcohol. To this was added ten grams of finely divided nickel flake. The mixture was then allowed to sit at room temperature to allow the alcohol to evaporate. The metallic flake was now essentially coated with the saturated carboxylic acid.

Example II

Preparation of Polymer Thick Film Containing Coated Metal

An epoxy resin mixture was made up by mixing 20% of o-creosol novolac resin (hydroxy type), 40% epoxy creosol novolac resin and 40% butyl carbital acetate with the resultant mixture placed on a shaker and shaked until the solids are dissolved into the solvent.

Three grams of coated nickel flake (coated as in Example I) was dispersed into one gram of the epoxy. Several passes of this paste through a 3 roll mill yielded a smooth creamy ink.

This ink was then screen printed onto glass epoxy type substrates to form test patterns. These printed parts were placed in a box oven at 165° C. for 30 minutes to cure the films. After removal from the oven and cooling the printed parts were fluxed with a rosin type flux (Kester 1544) and dipped into molten solder.

The result was essentially a smooth shiny coverage of solder on the printed pattern.

Example III

Preparation of Polymer Thick Film Without Coated Metal

The procedure of example II was followed exactly except that the metal was not coated with saturated carboxylic acid. The film was essentially non-solderable; almost none of the film accepted solder.

We claim:

1. A conductive composition having improved solderability comprising metal comprising nickel, coated with saturated monocarboxylic acid, and dispersed in an organic polymeric matrix.

2. The composition of claim 1 applied to a substrate to form a film.

3. The composition of claim 2 which is dried and cured.

4. The composition of claim 1 wherein the metal is in the form of powder, flake or sponge or mixtures thereof.

5. The composition of claim 1 wherein the organic polymeric matrix is selected from the group consisting of thermoset resins, epoxy resins, and phenolic resins.

6. The composition of claim 1 wherein the saturated monocarboxylic acid is defined by the formula:

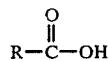

wherein R is a hydrocarbon group of the general formula $C_nH_{2n+1}$ wherein n is an integer from about 10 to 18.

7. The composition of claim 1 wherein the saturated monocarboxylic acid is a fatty acid.

8. The composition of claim 1 wherein the saturated monocarboxylic acid is selected from the group consisting of octadecanoic acid or n-heptadecanoic acid.

9. The composition of claim 1 wherein the ratio of metal to organic polymeric matrix is from about 5:3 to about 20:1, by weight.

10. The composition of claim 1 wherein the ratio of saturated monocarboxylic acid to metal is from about 1:1000 to about 1:30, by weight.

11. The composition of claim 1 wherein the metal is present in an amount of from about 50% to 85%, by weight.

12. The composition of claim 1 wherein the saturated monocarboxylic acid is present in an amount of from about 0.1 to 3% by weight.

13. A process for preparing readily solderable conductive compositions comprising coating metal comprising nickel with saturated monocarboxylic acid and thereafter dispersing the metal in an organic polymeric matrix.

14. The process of claim 13 wherein the organic polymeric matrix is selected from the group consisting of epoxy resins, themoset resins, and phenolic resins.

15. The process of claim 13 wherein the metal is powder, flake, or sponge or mixtures thereof.

16. The process of claim 13 wherein the saturated monocarboxylic acid is defined by the formula:

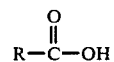

wherein R is a hydrocarbon group of the general formula $C_nH_{2n+1}$ wherein n is an integer from about 10 to about 18.

17. The process of claim 13 wherein the saturated monocarboxylic acid is a fatty acid.

18. The process of claim 13 wherein the saturated monocarboxylic acid is selected from the group consisting of n-heptadeconoic acid, hexadecanoic acid, octadeconic acid, tetradeconic acid, n-pentadecanoic acid, decanoic acid, undecanoic acid, nonadecanoic acid, dodecanoic acid and n-tridecanoic acid.

19. The process of claim 13 wherein the ratio of metal to organic polymeric matrix is form about 50:50 to about 85:15, by weight.

20. The process of claim 13 wherein the ratio of carboxylic acid to metal is from about 1:1000 to about 1:30, by weight.

21. A process of coating with a solderable conductive composition a substrate comprising dissolving an organic polymeric matrix in a solvent; dispersing metal comprising nickel coated with saturated monocarboxylic acid therein to form a mixture; applying said mixture to a substrate, and then curing the mixture.

22. The process of claim 21 wherein the organic polymeric matrix is an epoxy resin.

23. The process of claim 22 wherein the solvent is butyl carbitol acetate.

24. The process of claim 21 wherein the mixture is cured at a temperature of from about 125° C. to about 200° for about 30 seconds to two hours.

25. The process of claim 21 wherein the saturated monocarboxylic acid is octadecanoic or n-heptadecanoic acid.

26. An article comprising the composition of claim 3.

27. The article of claim 26 comprising a printed circuit board.

* * * * *